July 14, 1964 G. DAVIES 3,140,907

ELECTRICAL SPRING CONTACT SOCKETS

Filed May 29, 1961

Inventor
GEOFFREY DAVIES
By [signature]
Attorney

United States Patent Office 3,140,907
Patented July 14, 1964

3,140,907

ELECTRICAL SPRING CONTACT SOCKETS

Geoffrey Davies, London, England, assignor to International Standard Electric Corporation, New York, N.Y., a corporation of Delaware Filed May 29, 1961, Ser. No. 113,384
Claims priority, application Great Britain June 3, 1960
4 Claims. (Cl. 339—17)

This invention relates to spring contact sockets for use with printed circuit boards and has for its object to provide a compact form of socket contact which will accept a printed circuit board without applying destructive pressure to the copper foil on the board during insertion and removal of the board and also providing a secure retaining effect on the board.

The invention relates to spring contact sockets of the kind comprising a pair of jaws adapted to embrace the printed circuit board and having on at least one of the jaws a contact portion for making electrical connection with the conducting surface of the board and is characterised by the provision of a cam surface on the jaw which engages with the board and lifts the contact portion of the jaw out of contact with the conducting surface during the insertion and removal of the board from the socket contact, whereas the cam surface engages a recess in the board when the latter is in the fully inserted position to allow the contact portion of the jaw to engage the conducting surface.

The invention will be better understood by reference to the accompany drawings, in which.

Figure 1:
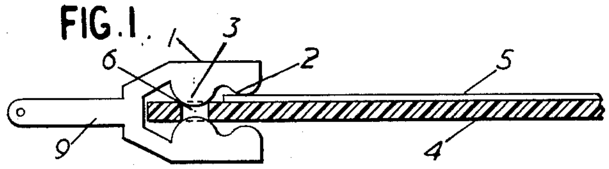
FIG. 1 is a side elevation of the socket with the board in position.

Referring to FIG. 1 it will be seen that the U-shaped contact 1 comprises a contact portion 2 and cam surface 3 on each jaw thereof. A printed circuit board is indicated at 4 with the copper foil 5 engaging the contact portion 2 on one side. The board is provided with a hole 6 which is large enough for the cam 3 to float freely as shown in FIG. 1 so that the contact portion 2 engages the copper foil due to the resilience of the U-shaped member. It will be noted that the foil does not extend to the end of the board, so that it is not subject to rubbing action by the cam.

Figure 2:
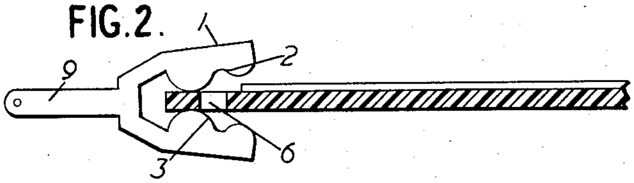
FIG. 2 is a similar view with the board partly withdrawn.

When the board is withdrawn the cam 3 rides out of the hole 6 into contact with the board, thus raising the contact portion 2 as clearly shown in the position in FIG. 2. Similarly when the board is inserted the cam surface keeps the contact member clear of the foil until the cam drops into the hole 6. This also provides a positive locking or holding means for the board against the spring action of the U-shaped member.

Figure 3:
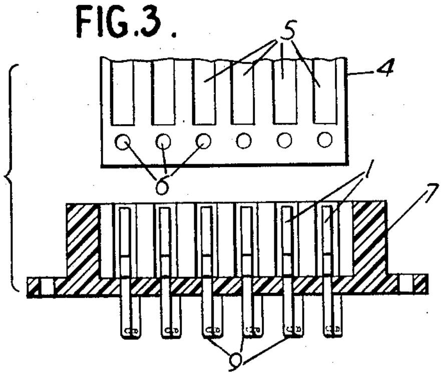
FIG. 3 is a part sectional elevation of a multi-contact socket with the board detached.
Figure 4:
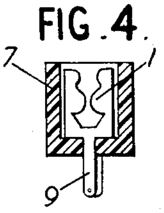
FIG. 4 is a sectional end elevation.
Figure 5:
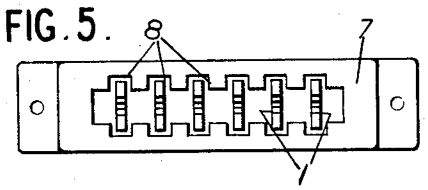
FIG. 5 is a plan thereof.

FIGS. 3, 4 and 5 show a simple form of assembly of such socket contact members into a multi-contact socket where it will be seen that a moulded block of insulating material 7 is provided with a plurality of recesses 8 into which the sockets are fitted, and these may be secured in position in the block by twisting the soldering tags 9 of the socket contact members through a slight angle to secure them against the base of the block. In FIG. 3 a portion of printed circuit board 4 having copper foil contact strips 5 for engagement with the sockets is indicated.

Figure 6:
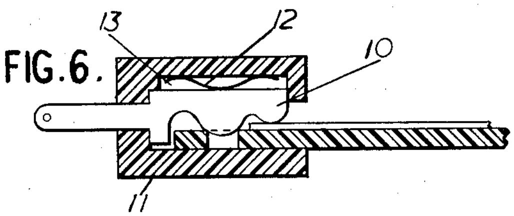
FIG. 6 is a sectional elevation of a modified constructor.

As shown the socket contact members are conveniently stamped or otherwise made out of one piece of spring contact metal with identical contact surfaces and cam surfaces on each jaw so that they are reversible, but it will be evident that the principle of the invention may be applied to other forms of construction. For example FIG. 6 illustrates an alternative arrangement in which a single contact jaw 10 is arranged with an insulating block 11 forming the jaws for receiving the printed circuit board. In this case the contact jaw may be spring loaded if desired as shown by the spring 12 located in the recess 13 in the block.

Although this invention has been described with special reference to printed circuit boards it will be understood that this term is intended to cover any form of so-called printed circuit board where flat conductors are arranged on an insulating panel and connection is made to them by sliding movement into the socket which would normally occasion wear on the contact surface.

It is to be understood that the foregoing description of specific examples of this invention is not to be considered as a limitation on its scope.

What I claim is:

1. An electrical socket for printed circuit boards comprising in combination:
   - a printed circuit board having
     - a conductive surface disposed on one surface of said board terminating at a predetermined distance from a given edge of said board, and
     - a recess in at least said one surface of said board intermediate the termination of said conductive surface and said given edge; and
   - a socket contact including as an integral unit at least
     - a first portion external of said given edge, and
     - a second portion spaced above said one surface of said board having
       - a contacting portion extending therefrom having a length sufficient to make an electrical connection with said conductive surface, and
       - a cam surface extending therefrom disposed intermediate said first portion and said contacting portion having a length longer than the length of said contacting portion to extend into and engage said recess for cooperation in releasably securing said socket and said board together.

2. An electrical socket for printed circuit boards comprising in combination:
   - a printed circuit board having
     - a conductive surface disposed on one surface of said board terminating at a predetermined distance from a given edge of said board, and
     - a hole extending through said board intermediate the termination of said conductive surface and said given edge; and
   - a socket contact of resilient metal including as an integral unit
     - a first portion external of said given edge,
     - a second portion connected to said first portion and spaced above said one surface of said board having
       - a contacting portion extending therefrom having a length sufficient to make an electrical connection with said conductive surface, and
       - a first cam surface extending therefrom disposed intermediate said first portion and said contacting portion having a length longer than the length of said contacting portion to extend into and engage said hole, and
     - a third portion connected to said first portion and spaced below the other surface of said board having at least a second cam surface extending therefrom having a length to extend into and engage said hole, said first and second cam surfaces and said hole releasably securing said socket and said board together.

3. An electrical socket for printed circuit boards comprising in combination a printed circuit board having a conductive surface disposed on one surface of said board terminating at a predetermined distance from a given edge of said board, and a recess in at least one surface of said board intermediate the termination of said conductive surface and said given edge; and a socket contact including as an integral unit at least a first portion external of said given edge, and a second portion spaced above said one surface of said board having a contacting portion extending therefrom having a length sufficient to make an electrical connection with said conductive surface, a cam surface extending therefrom disposed intermediate said first portion and said contacting portion having a length longer than the length of said contacting portion to extend into and engage said recess, an insulating block enclosing said second portion through which said first portion extends having a portion thereof engage the other surface of said board, and resilient means disposed between said second portion and an inner surface of said block for spring loading said second portion to releasably secure said socket and said board together.

4. A multiple contact electrical socket for printed boards comprising in combination:

a printed circuit board having a plurality of discrete conductive surfaces disposed on one surface of said board each terminating a predetermined distance from a given edge of said board, and a recess in at least said one surface of said board intermediate the termination of each of said conductive surfaces and said given edge; and a plurality of socket contacts disposed in a block of insulating material in registry with an associated one of said conductive surfaces and said recesses, each of said socket contacts including as an integral unit at least a first portion external of said given edge, and a second portion spaced above said one surface of said board having a contacting portion extending therefrom having a length sufficient to make an electrical connection with its associated one of said conductive surfaces, and a cam surface extending therefrom disposed intermediate said first portion and said contacting portion having a length longer than the length of said contacting portion to extend into and engage its associated one of said recesses for cooperation in releasably securing said socket contacts and said board together.

References Cited in the file of this patent

UNITED STATES PATENTS

| | | |
|---|---|---|
| 2,150,388 | Martindell | Mar. 14, 1939 |
| 2,811,700 | Kuch | Oct. 29, 1957 |
| 2,962,692 | White | Nov. 29, 1960 |

FOREIGN PATENTS

| | | |
|---|---|---|
| 911,279 | Germany | May 13, 1954 |